United States Patent
Liao et al.

(10) Patent No.: US 11,815,369 B2
(45) Date of Patent: Nov. 14, 2023

(54) DIFFERENTIAL CAPACITOR DEVICE AND METHOD FOR CALIBRATING DIFFERENTIAL CAPACITOR

(71) Applicant: INDUSTRIAL TECHNOLOGY RESEARCH INSTITUTE, Hsinchu (TW)

(72) Inventors: Lu-Po Liao, Taoyuan (TW); Chin-Fu Kuo, Tainan (TW); Liang-Ying Liu, Zhubei (TW); Yu-Sheng Lin, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1 day.

(21) Appl. No.: 17/863,341

(22) Filed: Jul. 12, 2022

(65) Prior Publication Data
US 2023/0184567 A1 Jun. 15, 2023

(30) Foreign Application Priority Data

Dec. 15, 2021 (TW) ................................ 110146959

(51) Int. Cl.
*G01D 5/24* (2006.01)
*G01R 27/26* (2006.01)
(Continued)

(52) U.S. Cl.
CPC ........... *G01D 5/24* (2013.01); *G01R 27/2605* (2013.01); *G01D 18/00* (2013.01); *G01R 35/005* (2013.01)

(58) Field of Classification Search
CPC .. G01D 5/00; G01D 5/12; G01D 5/14; G01D 5/24; G01D 18/00; G01R 27/00;
(Continued)

(56) References Cited

U.S. PATENT DOCUMENTS 5,659,262 A    8/1997   Memishian
5,902,925 A    5/1999   Crispie et al.
(Continued)

FOREIGN PATENT DOCUMENTS

CN    103078591 A   *   5/2013   ........... H03B 5/1296
CN    208506138 U   *   2/2019   ......... G01R 27/2605
(Continued)

OTHER PUBLICATIONS

TW Office Action in Application No. 110146959 dated Oct. 20, 2022.
(Continued)

*Primary Examiner* — Hoai-An D. Nguyen
(74) *Attorney, Agent, or Firm* — Maschoff Brennan

(57) ABSTRACT

The differential capacitor device includes a differential capacitor sensing component, a calibration capacitor assembly and two output terminals. The differential capacitive sensing element has a common point terminal, a first non-common point terminal and a second non-common point terminal, and the common point terminal is configured to receive an input voltage. The calibration capacitor assembly has a first calibration capacitor and a second calibration capacitor, one terminal of the calibration capacitor assembly is coupled to the first non-common point terminal and the second non-common point terminal, and the other terminal of the calibration capacitor assembly is configured to receive a first calibration voltage and a second calibration voltage. The two output terminals are respectively coupled to the first non-common point terminal and the second non-common point terminal to output a first signal and a second signal.

11 Claims, 8 Drawing Sheets

(51) Int. Cl.
*G01D 18/00* (2006.01)
*G01R 35/00* (2006.01)

(58) Field of Classification Search
CPC .... G01R 27/02; G01R 27/26; G01R 27/2605; G01R 35/00; G01R 35/005
USPC .................................................. 324/600, 601
See application file for complete search history.

(56) References Cited

U.S. PATENT DOCUMENTS

| | | | |
|---|---|---|---|
| 8,242,788 | B2 | 8/2012 | Hsu et al. |
| 8,299,837 | B1 | 10/2012 | Lin |
| 10,267,655 | B2 | 4/2019 | Oshima et al. |
| 2003/0107427 | A1 | 6/2003 | Vorenkamp et al. |
| 2009/0079498 | A1 | 3/2009 | Drost et al. |
| 2011/0248723 | A1 | 10/2011 | Yeh et al. |
| 2011/0254565 | A1 | 10/2011 | De Boer et al. |
| 2012/0218222 | A1 | 8/2012 | Shen et al. |
| 2017/0336893 | A1 | 11/2017 | Hanssen et al. |
| 2019/0293691 | A1 | 9/2019 | Holland et al. |
| 2020/0091608 | A1 | 3/2020 | Alpman et al. |

FOREIGN PATENT DOCUMENTS

| | | | | |
|---|---|---|---|---|
| TW | 200943699 | A | 10/2009 | |
| TW | 200952326 | A | 12/2009 | |
| TW | 201310898 | A | 3/2013 | |
| TW | 201417494 | A | 5/2014 | |
| TW | 201531022 | A | 8/2015 | |
| TW | 201810933 | A | 3/2018 | |
| TW | 201838352 | A | 10/2018 | |
| TW | 202143262 | A | 11/2021 | |
| WO | WO-2019144305 | A1 * | 8/2019 | ......... G01R 27/2605 |

OTHER PUBLICATIONS

Wu et al. "A Low-Noise Low-Offset Capacitive Sensing Amplifier for a 50ug rt Hz Monolithic CMOS MEMS Accelerometer" IEEE Journal of Solid-State Circuits, vol. 39, No. 5, p. 722-730, May 2004.

Lemkin et al. "A Three-Axis Micromachined Accelerometer with a CMOS Position-Sense Interface and Digital Offset-Trim Electronics" IEEE Journal of Solid-State Circuits, vol. 34, No. 4, p. 456-468, Apr. 1999.

Tan et al. "An Integrated Low-Noise Sensing Circuit With Efficient Bias Stabilization for CMOS MEMS Capacitive Accelerometers" IEEE Transactions on Circuits and Systems—I: Regular Papers, vol. 58, No. 11, p. 2661-2672, Nov. 2011.

* cited by examiner

DIFFERENTIAL CAPACITOR DEVICE AND METHOD FOR CALIBRATING DIFFERENTIAL CAPACITOR

CROSS-REFERENCE TO RELATED APPLICATIONS

This non-provisional application claims priority under 35 U.S.C. § 119(a) on Patent Application No(s). 110146959 filed in Taiwan on Dec. 15, 2021, the entire contents of which are hereby incorporated by reference.

BACKGROUND

1. Technical Field

The present disclosure relates to a differential capacitor device and a method of calibrating differential capacitor, and especially relates to a differential capacitor device and a method of calibrating differential capacitor which is able to regulate calibration capacitors and/or calibration voltages.

2. Related Art

Recently, capacitor sensing components adopt differential capacitor structures to have high performances because of performance demands. However, in manufacture and assembly, the non-ideality of capacitor sensing components usually results in mismatch variance in the capacitor sensing components. In addition to improvement in capability of precision to the manufacture of the capacitor pairs used in the capacitor sensing components, the most efficient solution to overcome the aforementioned problem is to couple the capacitor sensing component to an amplifier or a reading circuit, so as to identify an variance value (i.e. offset value) of the output terminal of the capacitor sensing component for calibration. Accordingly, the variance value of the output terminal of the capacitor sensing component is calibrated to satisfy a required specification.

SUMMARY

In light of the aforementioned description, the present disclosure sets forth a differential capacitor device and a method for calibrating differential capacitor.

One embodiment of the present disclosure sets forth a differential capacitor device comprising a differential capacitor sensing component, a calibration capacitor assembly and two output terminals. The differential capacitor sensing component is provided with a first differential capacitor and a second differential capacitor. One terminal of the first differential capacitor is coupled to one terminal of the second differential capacitor to form a common point terminal. The other terminal of the first differential capacitor is a first non-common point terminal and the other terminal of the second differential capacitor is a second non-common point terminal. The calibration capacitor assembly is provided with a first calibration capacitor and a second calibration capacitor. One terminal of the first calibration capacitor is coupled to the first non-common point terminal. One terminal of the second calibration capacitor is coupled to the second non-common point terminal. The other terminal of the first calibration capacitor is a first calibration voltage input terminal. The other terminal of the second calibration capacitor is a second calibration voltage input terminal. The first calibration voltage input terminal and the second calibration voltage input terminal are configured to receive a set of calibration voltages. Two output terminals are respectively coupled to the first non-common point terminal and the second non-common point terminal and configured to output a first signal and a second signal.

One embodiment of the present disclosure sets forth a method for calibrating differential capacitor performed by a controller to operate a differential capacitor device. The differential capacitor device includes a differential capacitor sensing component, a calibration capacitor assembly and two output terminals. The differential capacitor sensing component is provided with a common point terminal, a first non-common point terminal and a second non-common point terminal. The common point terminal is configured to receive an input voltage. The first non-common point terminal and the second non-common point terminal are configured to output a pair of differential signals. The calibration capacitor assembly is provided with a first calibration capacitor and a second calibration capacitor. One terminal of the first calibration capacitor is coupled to the first non-common point terminal and the other terminal of the first calibration capacitor is configured to receive a first calibration voltage. One terminal of the second calibration capacitor is coupled to the second non-common point terminal and the other terminal of the second calibration capacitor is configured to receive a second calibration voltage. The calibration capacitor assembly regulates the pair of differential signals to a first signal and a second signal. Two output terminals are respectively coupled to the first non-common point terminal and the second non-common point terminal to output a first signal and a second signal. The controller is configured to generate the first calibration voltage and the second calibration voltage, and to regulate the first calibration capacitor and the second calibration capacitor. The method of calibrating differential capacitor: calculating a offset value between a first output voltage and a second output voltage; determining whether the offset value is in a threshold range or not; completing calibration when determining the offset value is in the threshold range; at least regulating one of the first calibration voltage, the second calibration voltage, the first calibration capacitor and the second calibration capacitor to re-calculate the offset value when determining the offset value is not in the threshold range.

According to the aforementioned description, the present disclosure sets forth a differential capacitor device and a method for calibrating differential capacitor which is able to precisely compensate capacitor errors and decrease noise effectively under the case that manufacturing cost is not obviously increased. The differential capacitor device and the method of calibrating differential capacitor drive make the capacitor sensing component conduct signal compensation and processing by regulating calibration capacitors and voltage calibration signals.

The aforementioned context of the present disclosure and the detailed description given herein below are used to demonstrate and explain the concept and the spirit of the present invention and provides the further explanation of the claim of the present invention.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

It is needed to be understood that the term "include" is used to indicate that there is a particular technical feature, value, step of a method, process of a procedure, element and/or assembly. However, additional technical features, values, steps of method the, processes of the procedure, elements and/or assemblies are not thus excluded.

It is to be acknowledged that, although the terms "first", "second", "third" and so on may be used herein to describe various elements, these elements should not be limited by these terms. These terms are used only for the purpose of distinguishing one from another, not used to indicate the priority or order of elements or steps.

Figure 1:
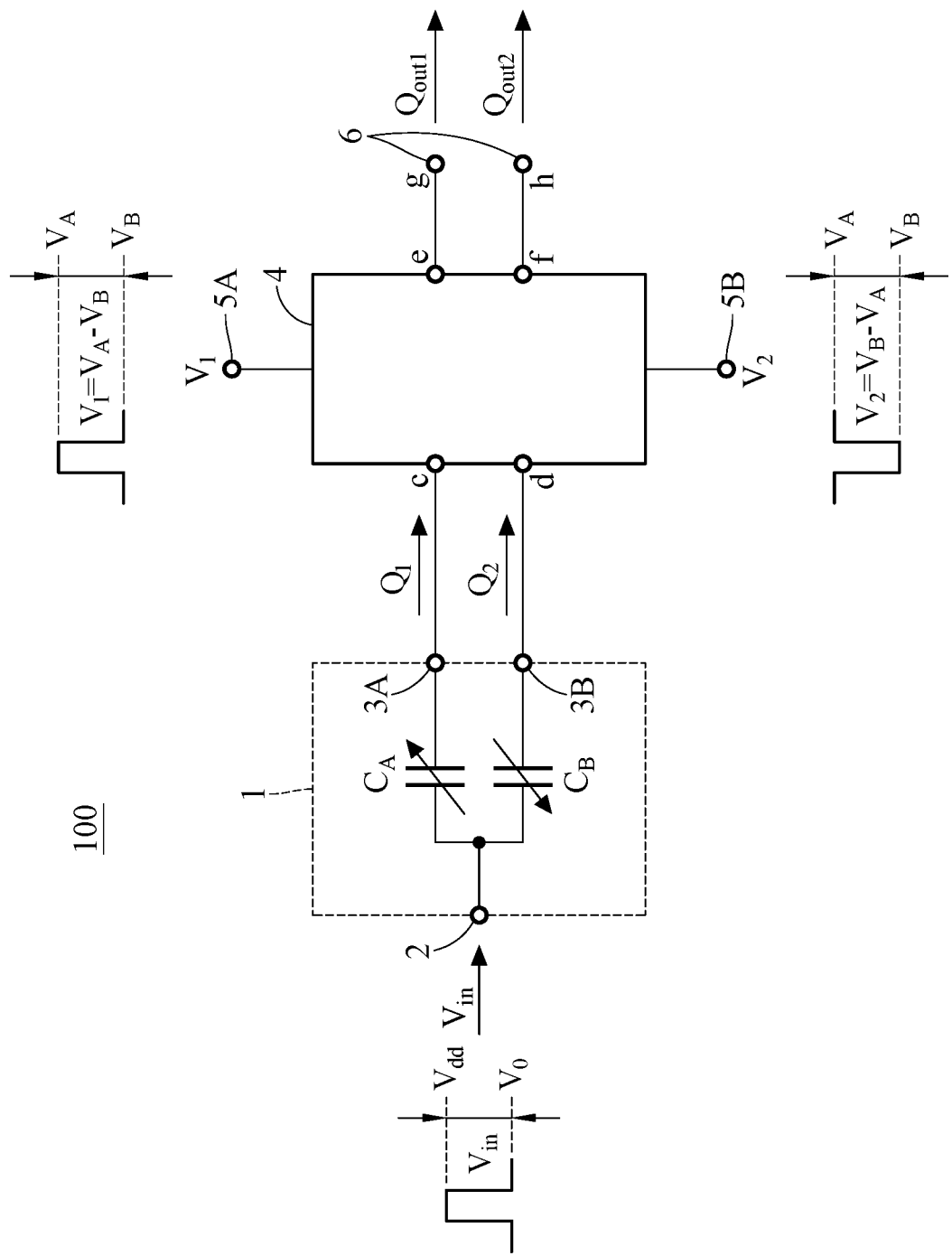
FIG. 1 is a circuit diagram of the differential capacitor device according to one embodiment of the present disclosure.
Figure 2B:
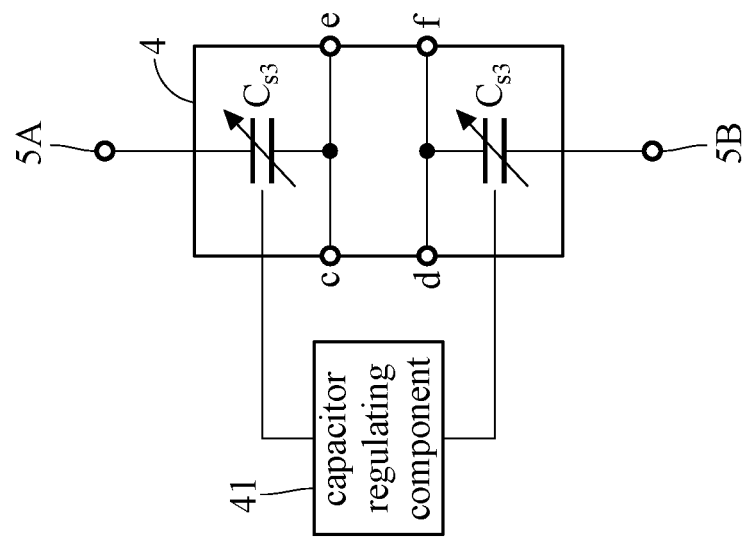
FIG. 2B is a circuit diagram of the calibration capacitor assembly of the differential capacitor device according to another embodiment of the calibration capacitor assembly of the present disclosure.
Figure 2A:
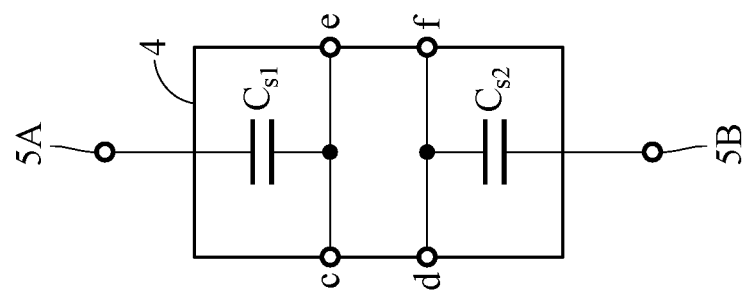
FIG. 2A is a circuit diagram of the calibration capacitor assembly of the differential capacitor device according to one embodiment of the calibration capacitor assembly of the present disclosure.

Please refer to FIG. 1 and FIG. 2A, wherein FIG. 1 is a circuit diagram of the differential capacitor device according to one embodiment of the present disclosure and FIG. 2A is a circuit diagram of the calibration capacitor assembly of the differential capacitor device according to one embodiment of the calibration capacitor assembly of the present disclosure. In one embodiment, as illustrated by FIG. 1, the differential capacitor device 100 may include a differential capacitor sensing component 1, a calibration capacitor assembly 4 and two output terminals 6. In order to clearly illustrate the output/input relationships between the differential capacitor device 100 and external signals, the differential capacitor device 100 is further defined to have a common point terminal 2, a first non-common point terminal 3A, a second non-common point terminal 3B, a first calibration voltage input terminal 5A and a second calibration voltage input terminal 5B.

The differential capacitor sensing component 1 may have a first differential capacitor $C_A$ and a second differential capacitor $C_B$. One terminal of the first differential capacitor $C_A$ and one terminal of the second differential capacitor $C_B$ are coupled with each other to form the common point terminal 2 for receiving an input voltage $V_{in}$. The input voltage $V_{in}$ is switching between a maximum voltage $V_{dd}$ and a minimum voltage $V_0$ at a fixed frequency $F_{in}$. For example, the input voltage $V_{in}$ may be a square wave. The other terminal of the first differential capacitor $C_A$ is a first non-common point terminal 3A and the other terminal of the second differential capacitor $C_B$ is a second non-common point terminal 3B. The first non-common point terminal 3A and the second non-common point terminal 3B are configured to output a pair of differential signals. The capacitor formula is shown as the following equation 1:

$$Q = C \times \Delta V \qquad \text{equation 1}$$

The parameter C in equation 1 is a capacitor value and a unit of the capacitor value may be farad (F). The parameter Q in equation 1 is an amount of charge and a unit of the amount of charge may be coulomb (C). The parameter $\Delta V$ of equation 1 is a voltage value and a unit of the voltage value may be volt (V). In an ideal situation, the amount of charge passing through the first non-common point terminal 3A is the same as the amount of charge passing through the second non-common point terminal 3B. Specifically, the aforementioned pair of differential signals may include a first differential signal $Q_1$ and a second differential signal $Q_2$. The amount of charge of the first differential signal $Q_1$ passing through the first non-common point terminal 3A is a product of the input voltage $V_{in}$ and the first differential capacitor $C_A$ (i.e. $Q_1 = C_A \times V_{in}$), and the amount of charge of the second differential signal $Q_2$ passing through the second non-common point terminal 3B is a product of the input voltage $V_{in}$ and the second differential capacitor $C_B$ (i.e. $Q_2 = C_B \times V_{in}$). In the ideal situation, differential capacitors match each other completely (i.e. $C_A = C_B$), and thus the amount of charge of the first differential signal $Q_1$ and the amount of charge of the second differential signal $Q_2$ also matches each other completely (i.e. the completely same value) and thus there is no deviation (i.e. $Q_1 - Q_2 = 0$).

However, in an actual situation, due to non-ideality in manufacture and assembly of capacitor sensing components, there is a mismatch variance with an offset value $C_{offset}$ between the first differential capacitor $C_A$ and the second differential capacitor $C_B$. The offset value $C_{offset}$ is the main object to be decreased in the present disclosure. Hence, the first differential capacitor $C_A$ and the second differential capacitor $C_B$ may be respectively expressed as follows by equation 2 and equation 3:

$$C_A = C_0 - \frac{1}{2}C_{offset} + \frac{1}{2}\Delta C \qquad \text{equation 2}$$

$$C_B = C_0 + \frac{1}{2}C_{offset} - \frac{1}{2}\Delta C \qquad \text{equation 3}$$

$C_0$ is an ideal capacitor programmed value of the differential capacitor sensing component 1. Because there is the offset value $C_{offset}$, it is preferable to calibrate the first differential signal $Q_1$ and the second differential signal $Q_2$ output by the differential capacitor sensing component 1. $\Delta C$ is a capacitor variation according to the signal detected by the differential capacitor sensing component 1 (i.e. a signal source generated due to a variation of the input voltage $V_{in}$), and the calibration capacitor assembly 4 is configured to calibrate the differential capacitor sensing component 1. In other words, the calibration capacitor assembly 4 is configured to decrease the aforementioned offset value $C_{offset}$. In one embodiment, as illustrated by FIG. 2A, the calibration capacitor assembly 4 has a first calibration capacitor $C_{s1}$ and a second calibration capacitor $C_{s2}$. One terminal of the first calibration capacitor $C_{s1}$ is coupled to the first non-common point terminal 3A. One terminal of the second calibration capacitor $C_{s2}$ is coupled to the second non-common point terminal 3B. The other terminal of the first calibration capacitor $C_{s1}$ is a first calibration voltage input terminal 5A. The other terminal of the second calibration capacitor $C_{s2}$ is a second calibration voltage input terminal 5B. The first calibration voltage input terminal 5A and the second calibration voltage input terminal 5B are configured to receive a set of calibration voltages. The set of calibration voltages includes a first calibration voltage and a second calibration voltage. Specifically, the calibration capacitor assembly 4 may receive a first calibration voltage $V_1$ by the first calibration voltage input terminal 5A, the first calibration voltage $V_1$ is between a maximum voltage $V_A$ and a minimum voltage $V_B$, and the phase of the first calibration voltage $V_1$ is the same as the phase of the input voltage $V_{in}$. The first calibration voltage $V_1$ is switching between the maximum voltage $V_A$ and the minimum voltage $V_B$ at the frequency $F_{in}$ and has an effect on the first calibration capacitor $C_{s1}$ to calibrate the first differential signal $Q_1$. The calibration capacitor assembly 4 may receive a second calibration voltage $V_2$ by the second calibration voltage input terminal 5B, the second calibration voltage $V_2$ is between a maximum voltage $V_A$ and a minimum voltage $V_B$, and the phase of the second calibration voltage $V_1$ is an inverted one of the phase of the input voltage $V_{in}$. The second calibration voltage $V_2$ is switching between the maximum voltage $V_A$ and the minimum voltage $V_B$ at the frequency $F_{in}$ and has an effect on the second calibration capacitor $C_{s2}$ to calibrate the second differential signal $Q_2$. Hence, after the first differential signal $Q_1$, the second differential signal $Q_2$ and a charge output difference between the first differential signal $Q_1$ and the second differential signal $Q_2$ are calibrated by the calibration capacitor assembly 4, the first differential signal $Q_1$, the second differential signal $Q_2$, and the charge output difference between the first differential signal $Q_1$ and the second differential signal $Q_2$ may be respectively expressed as follows by equations 4-6:

$$Q_1 = C_A \times V_{in} + C_{s1} \times V_1 = \left(C_0 - \frac{1}{2}C_{offset} + \frac{1}{2}\Delta C\right) \times V_{in} + C_{s1} \times V_1 \quad \text{equation 4}$$

$$Q_2 = C_B \times V_{in} + C_{s2} \times V_2 = \left(C_0 + \frac{1}{2}C_{offset} - \frac{1}{2}\Delta C\right) \times V_{in} + C_{s2} \times V_2 \quad \text{equation 5}$$

$$Q_1 - Q_2 = \Delta C \times V_{in} - (C_{offset}) \times V_{in} + (C_{s1} \times V_1 - C_{s2} \times V_2) \quad \text{equation 6}$$

A product of $\Delta C$ and the input voltage $V_{in}$ is an input signal of the differential capacitor sensing component 1, and a product of the offset value $C_{offset}$ and the input voltage $V_{in}$ is actually a mismatch variance of the differential capacitor sensing component 1. According to equation 6, the first differential signal $Q_1$ and the second differential signal $Q_2$ output by the differential capacitor sensing component 1, the sources of mismatch variation can be calibrated based on the first calibration capacitor $C_{s1}$, the second calibration capacitor $C_{s2}$, the first calibration voltage $V_1$ and the second calibration voltage $V_2$, so that the calibrated offset value $C_{offset}$ falls in a threshold range and is approximate to zero. Specifically, if $C_{s1}=C_{s2}$ and $V_1=-V_2$, the charge output difference between the first differential signal $Q_1$ and the second differential signal $Q_2$ to be calibrated may be expressed by the following equation 7:

$$Q_1 - Q_2 = \Delta C \times V_{in} - (C_{offset}) \times V_{in} + 2(C_{s1} \times V_1) \quad \text{equation 7}$$

To clearly interpret the calibration capacitor assembly 4, please refer to FIG. 1 and FIG. 2B, wherein FIG. 2B is a circuit diagram of the calibration capacitor assembly of the differential capacitor device according to another embodiment of the calibration capacitor assembly of the present disclosure. In the present embodiment, as illustrated by FIG. 2B, each of the first calibration capacitor $C_{s1}$ and the second calibration capacitor $C_{s2}$ of the calibration capacitor assembly 4 may be a programmable capacitor array $C_{s3}$. The programmable capacitor arrays $C_{s3}$ may provide a user to appropriately regulate capacitor values of the calibration capacitor assembly 4 to calibrate the first differential signal $Q_1$ and the second differential signal $Q_2$ output by the differential capacitor sensing component 1 for the calibrated offset value $C_{offset}$ to be in the threshold range and approximate to zero ideally. Adjustable capacitor values of the aforementioned programmable capacitor arrays $C_{s3}$ may be disposed according to a specification demand, and the present disclosure is not limited thereto. In the present embodiment, the calibration capacitor assembly 4 may further include a capacitor regulating component 41. The capacitor regulating component 41 is coupled to the aforementioned programmable capacitor arrays $C_{s3}$ and provides the user to appropriately regulate capacitor values of the aforementioned programmable capacitor arrays $C_{s3}$ to calibrate the first differential signal $Q_1$ and the second differential signal $Q_2$ output by the differential capacitor sensing component 1. For example, the capacitor regulating component 41 may be a physical component such as one implemented by a dual in-line package switch (DIP switch) or a slide switch, or may be a virtual component that is implemented by a communication device and a software operation interface.

Figure 2D:
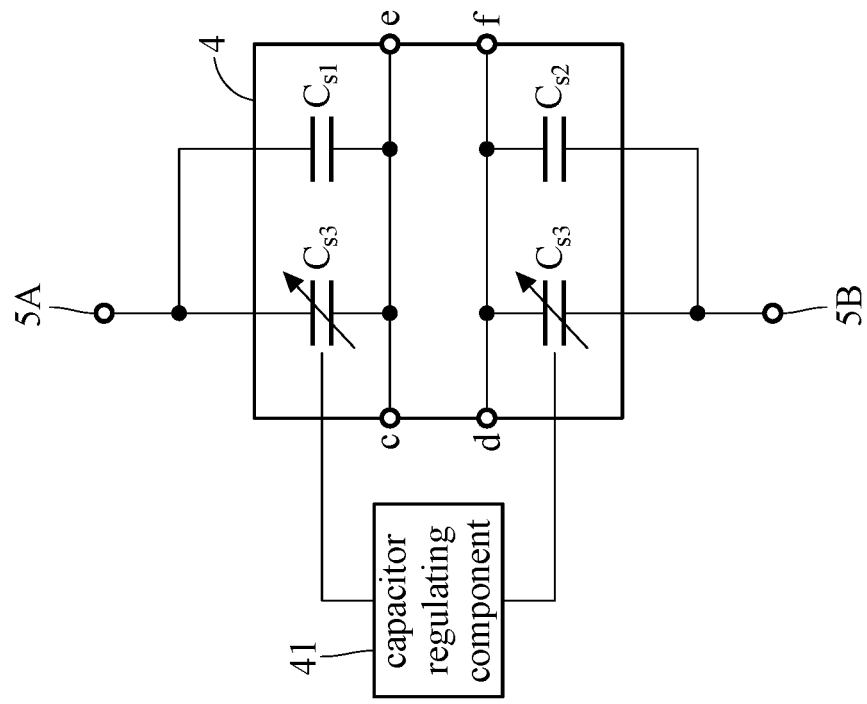
FIG. 2D is a circuit diagram of the calibration capacitor assembly of the differential capacitor device according to a still further embodiment of the calibration capacitor assembly of the present disclosure.
Figure 2C:
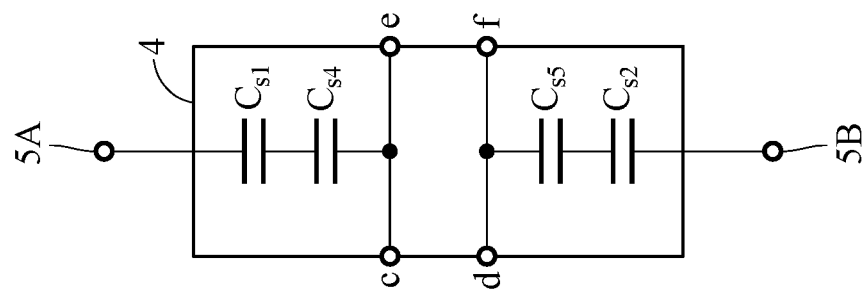
FIG. 2C is a circuit diagram of the calibration capacitor assembly of the differential capacitor device according to further another embodiment of the calibration capacitor assembly of the present disclosure.

Please refer to FIG. 1 and FIG. 2C, and FIG. 2C is a circuit diagram of the calibration capacitor assembly of the differential capacitor device according to further another embodiment of the calibration capacitor assembly of the present disclosure. In the present embodiment, as illustrated by FIG. 2C, the calibration capacitor assembly 4 may further include a first auxiliary capacitor $C_{s4}$ and a second auxiliary capacitor $C_{s5}$. One terminal of the first auxiliary capacitor $C_{s4}$ is coupled to the first calibration capacitor $C_{s1}$, and the other terminal of the first auxiliary capacitor $C_{s4}$ is coupled to the first calibration voltage input terminal 5A or the first non-common point terminal 3A. One terminal of the second auxiliary capacitor $C_{s5}$ is coupled to the second calibration capacitor $C_{s2}$, and the other terminal of the second auxiliary capacitor $C_{s5}$ is coupled to the second calibration voltage input terminal 5B or the second non-common point terminal 3B. Although the first auxiliary capacitor $C_{s4}$ and the second auxiliary capacitor $C_{s5}$ in FIG. 2C are respectively connected to the first calibration capacitor $C_{s1}$ and the second calibration capacitor $C_{s2}$ in series for decreasing an equivalent capacitor value of the calibration capacitor assembly 4, the first auxiliary capacitor $C_{s4}$ and the second auxiliary capacitor $C_{s5}$ may be respectively connected to the first calibration capacitor $C_{s1}$ and the second calibration capacitor $C_{s2}$ in parallel to increase the equivalent capacitor value of the calibration capacitor assembly 4. Hereby, depending on the demand, when the first differential signal $Q_1$ and the second differential signal $Q_2$ output by the differential capacitor sensing component 1 are calibrated, the capacitor value of the calibration capacitor assembly 4 may be specially regulated. Furthermore, in the aforementioned calibration capacitor assembly 4 as illustrated by FIG. 2C, each of the first calibration capacitor $C_{s1}$ and the second calibration capacitor $C_{s2}$ may be replaced with a plurality of capacitors.

Please refer to FIG. 1 and FIG. 2D, and FIG. 2D is a circuit diagram of the calibration capacitor assembly of the differential capacitor device according to a still further embodiment of the calibration capacitor assembly of the present disclosure. As illustrated by FIG. 2D, in comparison with embodiments illustrated by FIG. 2B and FIG. 2C, the calibration capacitor assembly 4 in the present embodiment is connected to additional programmable capacitor arrays $C_{s3}$ in parallel in addition to the first calibration capacitor $C_{s1}$ and the second calibration capacitor $C_{s2}$ having fixed capacitance. The programmable capacitor arrays $C_{s3}$ in the present embodiment may not only increase the equivalent capacitance of the calibration capacitor assembly 4, but also provide the user with a possibility to appropriately decide the increasing in the capacitor value of the calibration capacitor assembly 4, so that a variable range of the first differential signal $Q_1$ and the second differential signal $Q_2$ output by the differential capacitor sensing component 1 is increased. The calibration capacitor assembly 4 in the present embodiment may also include the capacitor regulating component 41 to regulate capacitor values of the aforementioned programmable capacitor arrays $C_{s3}$.

Please refer to FIG. 1 again and also refer to either one of FIG. 2A to FIG. 2D. The two output terminals 6 are respectively coupled to the first non-common point terminal 3A and the second non-common point terminal 3B. The output terminals 6 are configured to output a first signal $Q_{out1}$ passing through the first non-common point terminal 3A and a first output terminal g (i.e. from the first non-common point terminal 3A to the point g through points c and e) and to output a second signal $Q_{out2}$ passing through the second non-common point terminal 3B and a second output terminal h (i.e. from the second non-common point terminal 3B to the point g through points d and f). In other words, after the aforementioned calibration, the amount of charge of the first signal $Q_{out1}$ and the amount of charge of the second signal $Q_{out2}$ match each other completely (i.e. the two values are completely the same) or the difference thereof is in a threshold range (i.e. the two values are approximately equal) at least.

Figure 3:
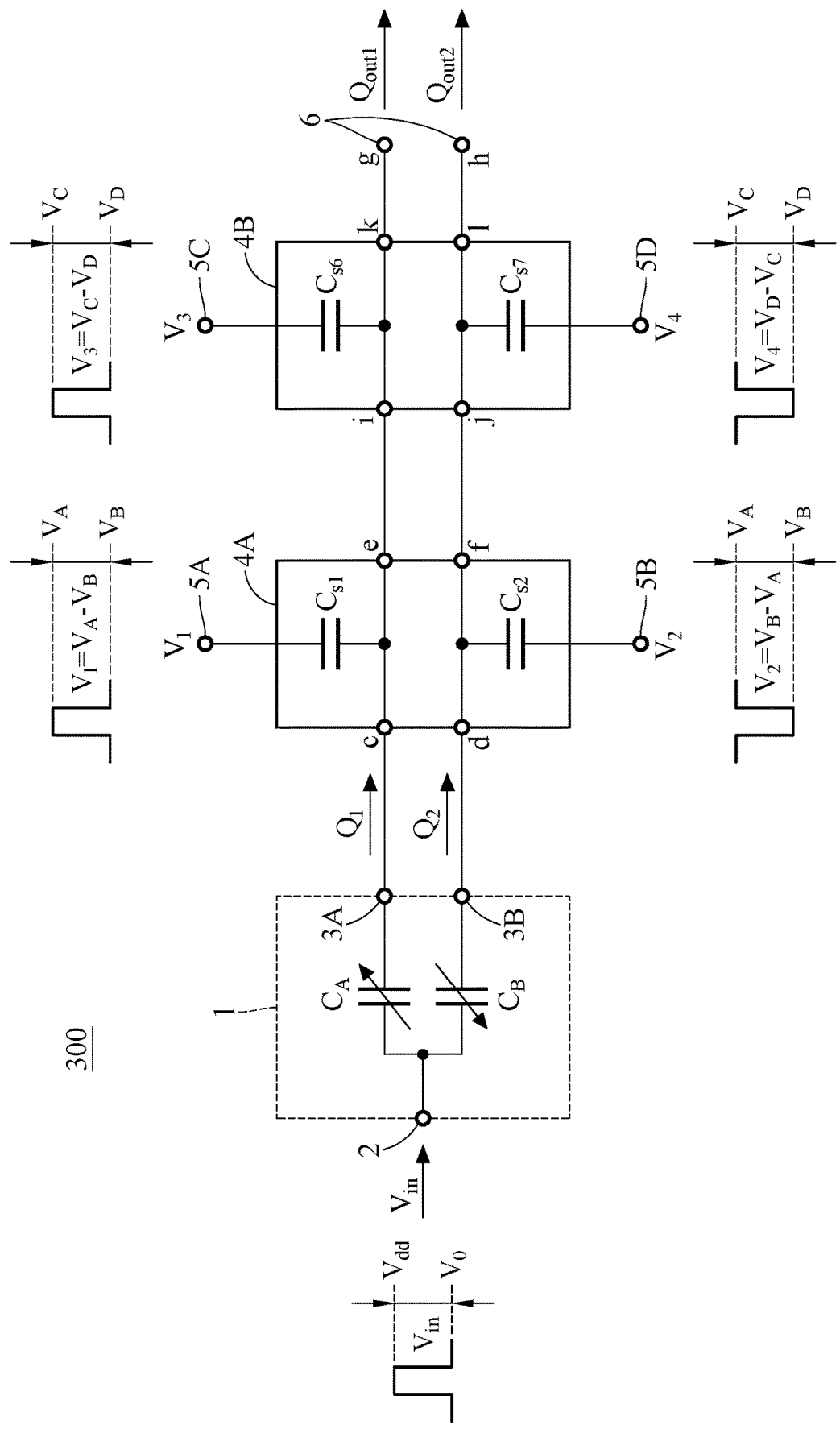
FIG. 3 is a circuit diagram of the differential capacitor device according to another embodiment of the present disclosure.
Figure 4:
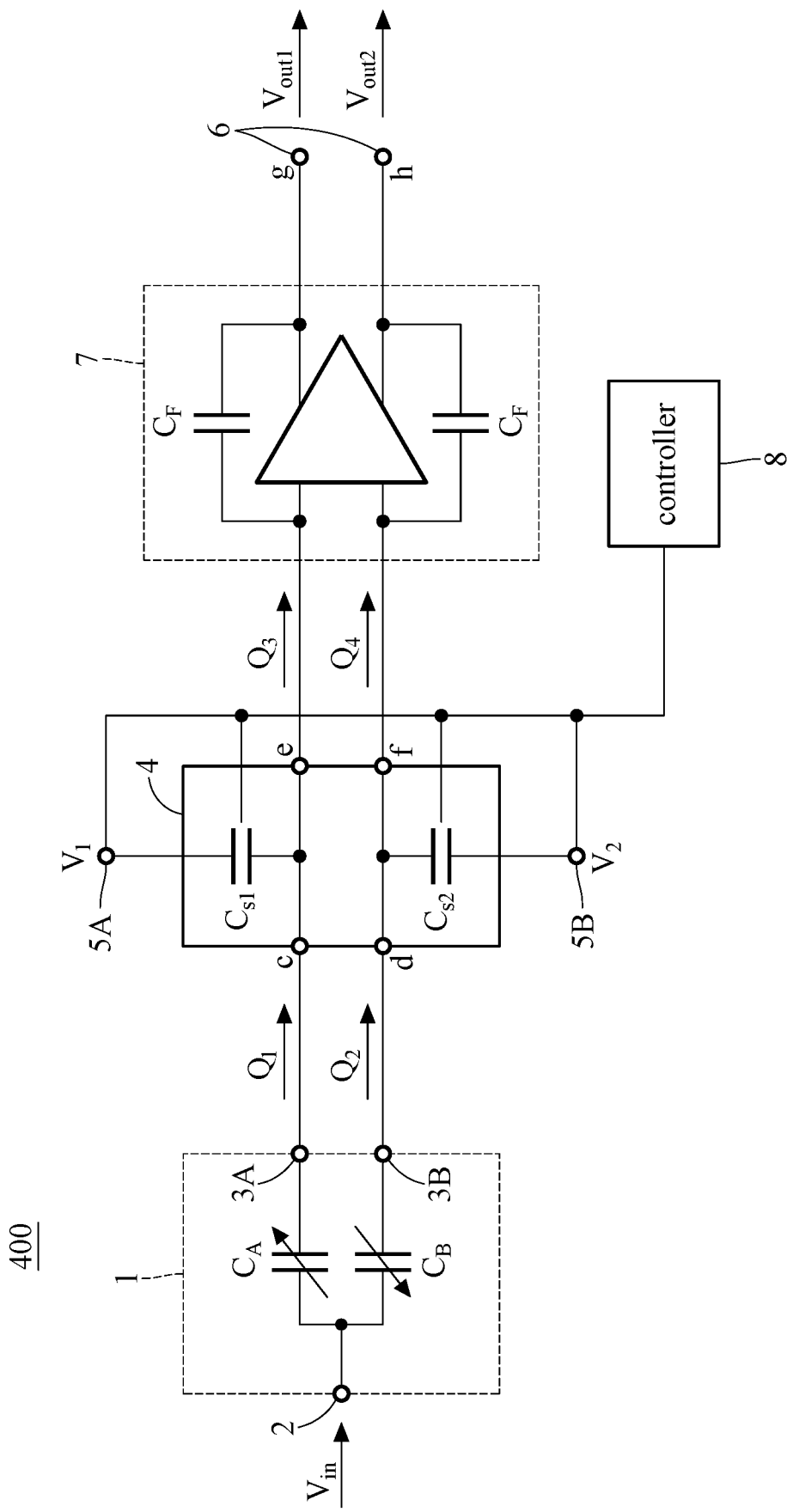
FIG. 4 is a circuit diagram of the differential capacitor device according to further another embodiment of the present disclosure.

Please refer to FIG. 3, which is a circuit diagram of the differential capacitor device according to another embodiment of the present disclosure. In comparison with the differential capacitor device 100 in the aforementioned embodiment, the differential capacitor device 300 in the present embodiment may include a plurality of the calibration capacitor assemblies. For example, as illustrated by FIG. 3, the plurality of the calibration capacitor assemblies includes a first calibration capacitor assembly 4A and a second calibration capacitor assembly 4B. The first calibration capacitor assembly 4A may serve as the calibration capacitor assembly 4 as illustrated by FIG. 1 and FIG. 2A to FIG. 2D, and the second calibration capacitor assembly 4B may be coupled between the first calibration capacitor assembly 4A and the two output terminals 6. The second calibration capacitor assembly 4B has a third calibration capacitor $C_{s6}$ and a fourth calibration capacitor $C_{s7}$. One terminal of the third calibration capacitor $C_{s6}$ may be coupled to the first non-common point terminal 3A (i.e. point e). One terminal of the fourth calibration capacitor $C_{s7}$ may be coupled to the second non-common point terminal 3B (i.e. point f). The other terminal of the third calibration capacitor $C_{s6}$ may be coupled to a third calibration voltage input terminal 5C. The other terminal of the fourth calibration capacitor $C_{s7}$ may be coupled to a fourth calibration voltage input terminal 5D. The third calibration voltage input terminal 5C and the fourth calibration voltage input terminal 5D are configured to receive another set of calibration voltages. Specifically, the second calibration capacitor assembly 4B may receive a third calibration voltage $V_3$ by the third calibration voltage input terminal 5C, and the third calibration voltage $V_3$ is between a maximum voltage $V_C$ and a minimum voltage $V_D$ and a phase of the third calibration voltage $V_3$ is the same as the phase of the input voltage $V_{in}$ and the phase of the first calibration voltage $V_1$. The third calibration voltage $V_3$ is switching between the maximum voltage $V_C$ and the minimum voltage $V_D$ at the same frequency $F_{in}$ and has an effect on the third calibration capacitor $C_{s6}$ to re-calibrate the first differential signal $Q_1$ after calibration of the first calibration capacitor assembly 4A. The second calibration capacitor assembly 4B may receive a fourth calibration voltage $V_4$ by the fourth calibration voltage input terminal 5D, and the fourth calibration voltage $V_4$ is between a maximum voltage $V_C$ and a minimum voltage $V_D$. A phase of the fourth calibration voltage $V_4$ is an inverted one of the phase of the input voltage $V_{in}$ and is the same as the phase of the second calibration voltage $V_2$. The fourth calibration voltage $V_4$ is switching between the maximum voltage $V_C$ and the minimum voltage $V_D$ at the same frequency $F_{in}$ and has an effect on the fourth calibration capacitor $C_{s7}$ to re-calibrate the second differential signal $Q_2$ after calibration of the first calibration capacitor assembly 4A. Similarly, the second calibration capacitor assembly 4B may be performed by one of the calibration capacitor assemblies 4 as illustrated by FIG. 2B to FIG. 2D. Hence, the calibration capacitor assemblies are disposed to precisely calibrate the first differential signal $Q_1$ and the second differential signal $Q_2$ output by the differential capacitor sensing component 1 in the differential capacitor device 300. The calibrated offset value $C_{offset}$ falls in a threshold range and is approximate to zero Please refer to FIG. 4, which is a circuit diagram of the differential capacitor device according to another embodiment of the present disclosure. In comparison with the differential capacitor device 100 in the aforementioned embodiment, the differential capacitor device 400 in the present embodiment may further include an output stage circuit, such as the charge voltage converting circuit 7 with a plurality of corresponding capacitors $C_F$ shown in FIG. 4. The charge voltage converting circuit 7 is coupled between the calibration capacitor assembly 4 and the two output terminals 6, configured to amplify and convert the calibrated first differential signal $Q_1$ and the calibrated second differential signal $Q_2$ into a third differential signal $Q_3$ and a fourth differential signal $Q_4$. The first signal $Q_{out1}$ and the second signal $Q_{out2}$ output by the two output terminals 6 are converted into a first output voltage $V_{out1}$ and a second output voltage $V_{out2}$. Besides, the aforementioned output stage circuit may further include other circuits in addition to the charge voltage converting circuit 7, such as a voltage amplifier or an analog-to-digital converter connected in series to the charge voltage converting circuit 7, with the voltage amplifier configured to amplify the output signal continuously and the analog-to-digital converter configured to re-convert the output analog signal into a digital signal. However, the present disclosure is not limited thereto.

For example, if the differential capacitor sensing component 1 of the differential capacitor device 400 receives the input voltage $V_{in}$, the amount of charge of the first differential signal $Q_1$ and the amount of charge of the second differential signal $Q_2$ do not match each other (i.e. two values are different) and thus there is an offset voltage $V_{offset}$. In order to achieve the purpose that the amount of charge of the first differential signal $Q_1$ and the amount of charge of the second differential signal $Q_2$ output by the two output terminals 6 match each other completely (the two values are completely the same) or the difference thereof is in a threshold range (i.e. the two values are approximately equal), the first calibration voltage $V_1$ and the second calibration voltage $V_2$ are regulated to be a voltage value $V_S$, and the first calibration capacitor $C_{s1}$ and the second calibration capacitor $C_{s2}$ are regulated to be a capacitor value $C_S$. The calibrated third differential signal $Q_3$ and fourth differential signal $Q_4$ are amplified by the charge voltage converting circuit 7 and the charge voltage converting circuit 7 outputs the first signal $Q_{out1}$ and the second signal $Q_{out2}$. A variation of the offset voltage $V_{offset}$ due to the offset value $C_{offset}$ is derived according to a calculation formula of equation 8 as follows:

$$V_{offset} = V_{in} * \left(\frac{C_A - C_B}{C_F}\right) - 2 * V_S * \frac{C_S}{C_F} \quad \text{equation 8}$$

In equation 8, it is assumed that both of the first calibration voltage $V_1$ and the second calibration voltage $V_2$ are of the voltage value $V_S$, both of the first calibration capacitor $C_{s1}$ and the second calibration capacitor $C_{s2}$ are of the capacitor value $C_S$, the aforementioned offset voltage $V_{offset}$ is zero ideally after the amount of charge of the first differential signal $Q_1$ and the amount of charge of the second differential signal $Q_2$ are calibrated by the charge voltage converting circuit 7. However, the aforementioned offset voltage $V_{offset}$ can also be calibrated by regulating one of the first calibration voltage $V_1$, the second calibration voltage $V_2$, the first calibration capacitor $C_{s1}$ and the second calibration capacitor $C_{s2}$ to carry out a result in which the aforementioned offset voltage $V_{offset}$ is zero. The pair of amplifying capacitors $C_F$ in the charge voltage converting circuit 7 may amplify the aforementioned offset voltage $V_{offset}$. In the present embodiment, the pair of amplifying capacitors $C_F$ may be programmable capacitor arrays to regulate an amplification ratio of the aforementioned offset voltage $V_{offset}$.

Figure 5:
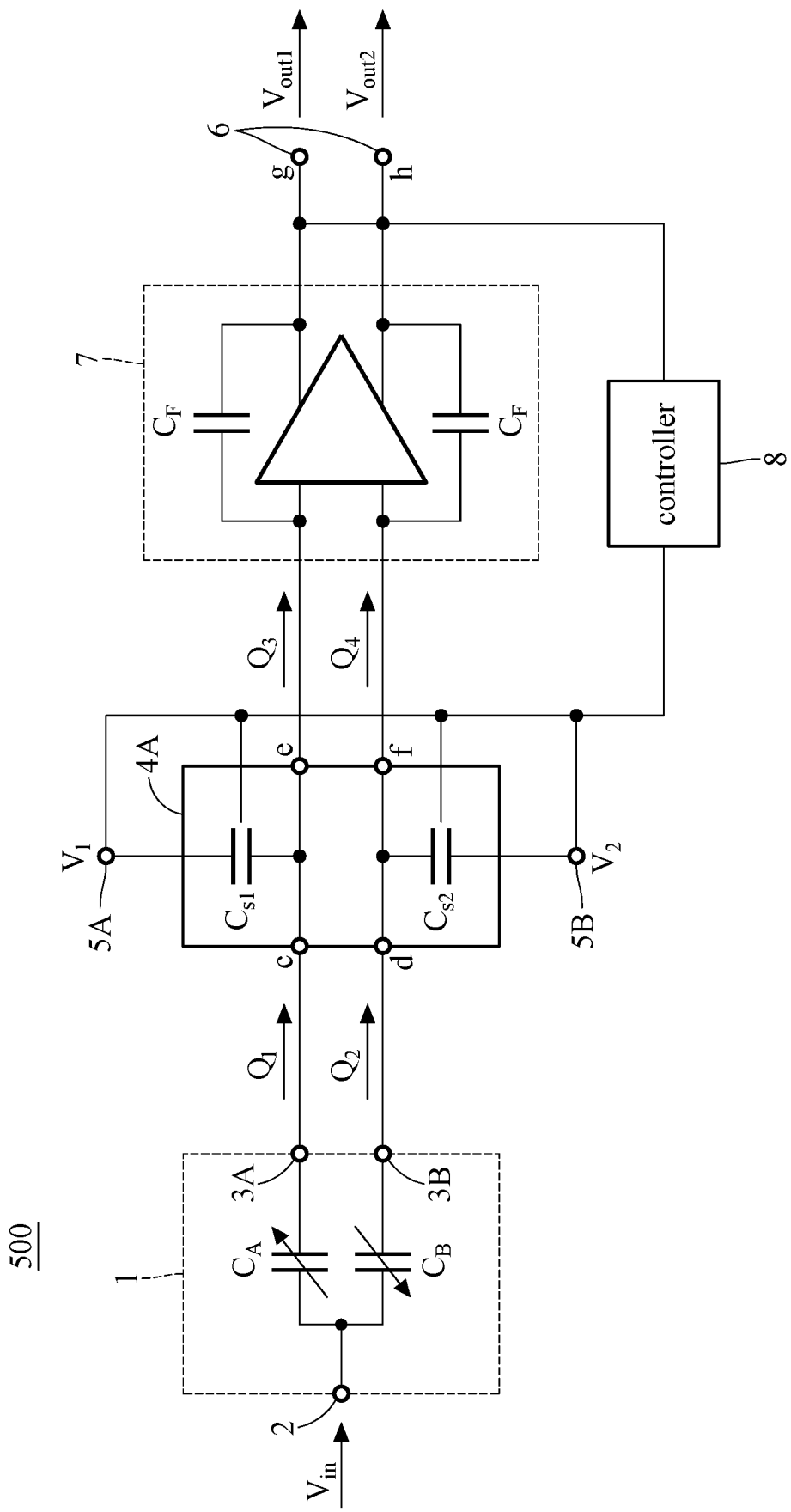
FIG. 5 is a circuit diagram of the differential capacitor device according to a still further embodiment of the present disclosure.

Please refer to FIG. 4 again. The differential capacitor device 400 may further include a controller 8. The controller 8 is coupled to the first calibration voltage input terminal 5A, the second calibration voltage input terminal 5B, the first calibration capacitor $C_{s1}$ and the second calibration capacitor $C_{s2}$ to regulate the first calibration voltage $V_1$, the second calibration voltage $V_2$, the first calibration capacitor $C_{s1}$ and the second calibration capacitor $C_{s2}$. To clearly illustrate the controller 8, please refer to FIG. 4 and FIG. 5, wherein FIG. 5 is a circuit diagram of the differential capacitor device according to another embodiment of the present disclosure. In the present embodiment, as illustrated by FIG. 5, specifically, the controller 8 is selectively coupled to the two output terminals 6 to constitute a feedback circuit. Voltage values of the first calibration voltage $V_1$ and the second calibration voltage $V_2$ and/or capacitor values of the first calibration capacitor $C_{s1}$ and the second calibration capacitor $C_{s2}$ are regulated according to the first output voltage $V_{out1}$ and the second output voltage $V_{out2}$ output by the two output terminals 6. For example, self-calibration of the differential capacitor device 500 is performed by a gradually repeated regulating method. Namely, the controller 8 may gradually regulate the calibrated offset voltage $V_{offset}$ to be in the threshold range and the offset voltage $V_{offset}$ is approximate to zero ideally.

For example, when the differential capacitor device 400 identifies the existence of the offset voltage $V_{offset}$, the first calibration voltage $V_1$ and/or the second calibration voltage $V_2$ are regulated by the controller 8. If the regulated first calibration voltage $V_1$ and the regulated second calibration voltage $V_2$ achieve extremums due to an apparatus limitation (for example, the first calibration voltage $V_1$ and the second calibration voltage $V_2$ provided by a power supply unit has a maximum/minimum voltage threshold value) and the amount of charge of the calibrated first signal $Q_{out1}$ and the amount of charge of the second signal $Q_{out2}$ are still unable to match each other completely (the two values are completely the same) or the difference thereof is in a threshold range (i.e. the two values are approximately equal), the first calibration capacitor $C_{s1}$ and the second calibration capacitor $C_{s2}$ are additionally regulated for calibration.

Similarly, when the differential capacitor device 400 identifies the offset voltage $V_{offset}$, the first calibration capacitor $C_{s1}$ and/or the second calibration capacitor $C_{s2}$ are regulated by the controller 8. If the regulated first calibration capacitor $C_{s1}$ and the regulated second calibration capacitor $C_{s2}$ achieves an extremum due to element limitation (for example, limitation of capacitor values of the first calibration capacitor $C_{s1}$ and the second calibration capacitor $C_{s2}$, or the first calibration capacitor $C_{s1}$ and the second calibration capacitor $C_{s2}$ are all programmable capacitor arrays $C_{s3}$, and capacitor values of programmable capacitor arrays $C_{s3}$ are maximum/minimum capacitor threshold values), when the amount of charge of the calibrated first signal $Q_{out1}$ and the amount of charge of the second signal $Q_{out2}$ are unable to match each other completely (the two values are completely the same) or the difference thereof is in a threshold range (i.e. the two values are approximately equal), the first calibration voltage $V_1$ and/or the second calibration voltage $V_2$ are additionally regulated for calibration.

Figure 6:
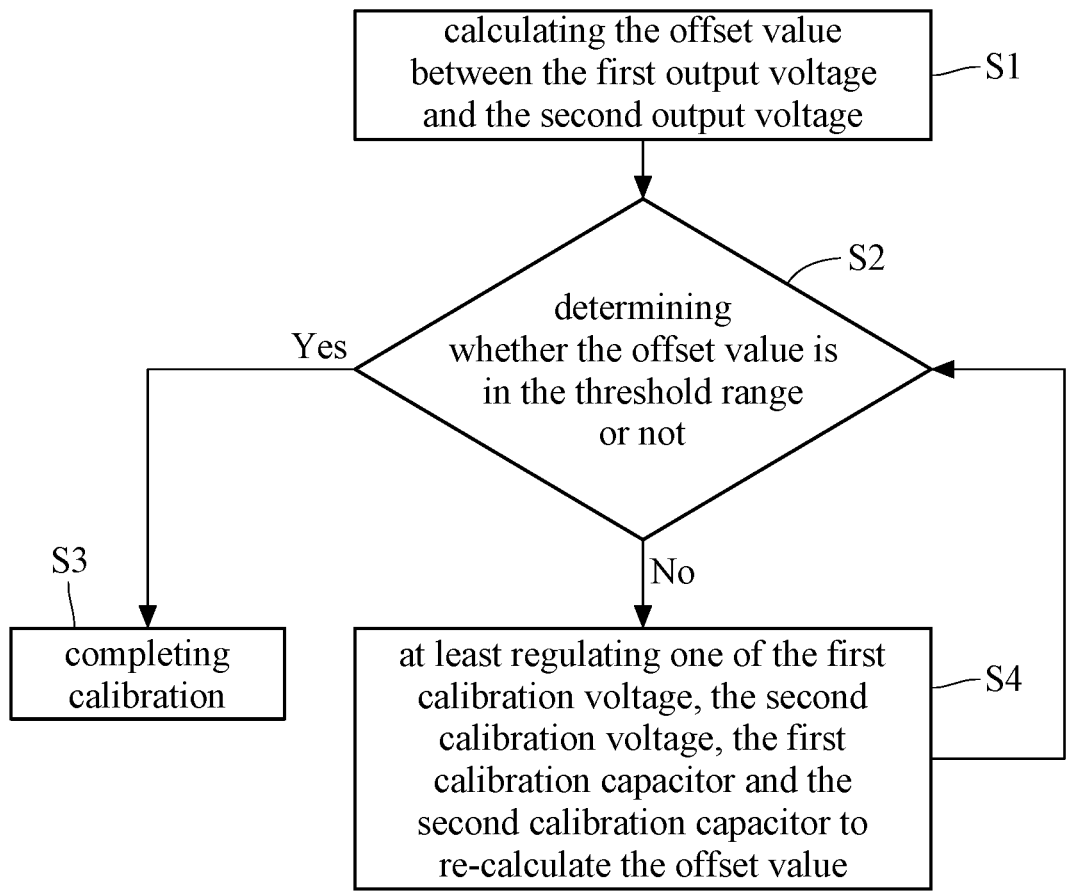
FIG. 6 is a flowchart of the method for calibrating differential capacitor according to one embodiment of the present disclosure.
Figure 7:
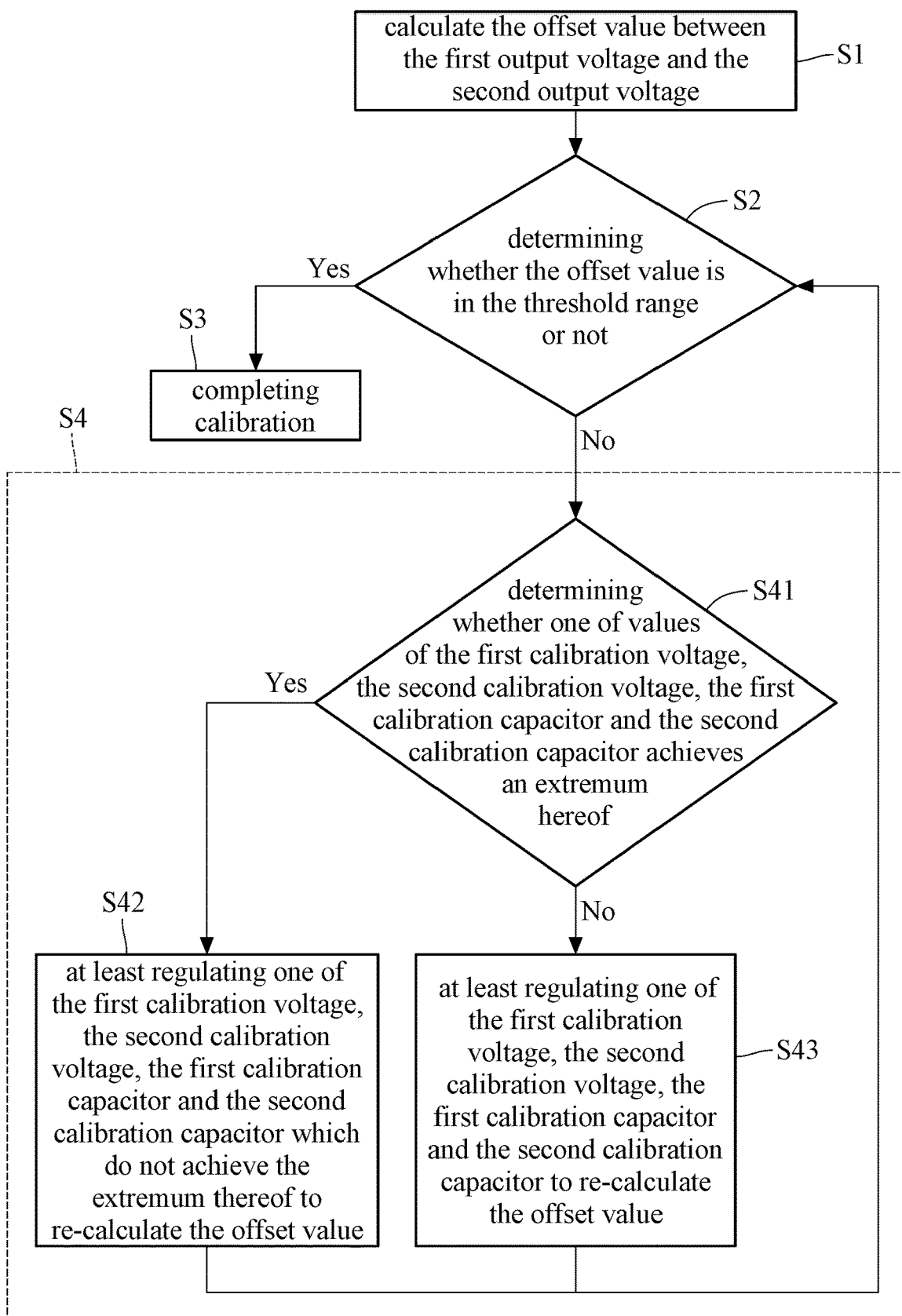
FIG. 7 is a flowchart of step S4 in the method for calibrating differential capacitor according to another embodiment of the present disclosure.

Please refer to FIG. 6 and FIG. 7, wherein, FIG. 6 is a flowchart of the method for calibrating differential capacitor according to one embodiment of the present disclosure and FIG. 7 is a flowchart of step S4 in the method for calibrating differential capacitor according to another embodiment of the present disclosure.

In one embodiment, as illustrated by FIG. 6, in step S1, the controller 8 may calculate the offset voltage $V_{offset}$ between the first output voltage $V_{out1}$ and the second output voltage $V_{out2}$. In step S2, the controller 8 determines whether the offset voltage $V_{offset}$ is in the threshold range or not.

When the aforementioned offset voltage $V_{offset}$ is in the threshold range, step S3 is performed. In step S3, because the aforementioned offset voltage $V_{offset}$ is in the threshold range, the first differential capacitor $C_A$ and the second differential capacitor $C_B$ are approximate to an ideal situation and there is almost no offset, and there is no need to do any operation and the calibration is completed.

When the aforementioned offset voltage $V_{offset}$ is out of the threshold range, step S4 is performed. In step S4, because the aforementioned offset voltage $V_{offset}$ is out of the threshold range, the first differential capacitor $C_A$ and the second differential capacitor $C_B$ actually exist the mismatch variance and there is an offset. The first differential signal $Q_1$ and the second differential signal $Q_2$ output by the differential capacitor sensing component 1 are needed to calibrate. And then, at least one of the first calibration voltage $V_1$, the second calibration voltage $V_2$, the first calibration capacitor $C_{s1}$ and the second calibration capacitor $C_{s2}$ is regulated by the controller 8 to re-calculate the offset voltage $V_{offset}$ and determine whether the biasing is in the threshold range or not. Besides, after step S4 is completed, step S1 may be performed again. After the first differential signal $Q_1$ and the second differential signal $Q_2$ are calibrated, the current offset voltage $V_{offset}$ between the output first output voltage $V_{out1}$ and the output second output voltage $V_{out2}$ is re-calculated. The current offset voltage $V_{offset}$ is determined whether to calibrate the first differential signal $Q_1$ and the second differential signal $Q_2$ or not.

In another embodiment, as illustrated by FIG. 7, step S4 may be divided into step S41~step S43. In step S41, the controller 8 may determine whether at least one of the first calibration voltage $V_1$, the second calibration voltage $V_2$, the first calibration capacitor $C_{s1}$ and the second calibration capacitor $C_{s2}$ are the extremum (maximum/minimum voltage values or maximum/minimum capacitor values) or not, the controller 8 determines whether to be limited to the limitation of apparatus/element and is unable to regulate (for example, regulating the limitation of the first calibration voltage $V_1$, the second calibration voltage $V_2$ of the power supply unit, the limitation of capacitor values of the first calibration capacitor $C_{s1}$ and the second calibration capacitor $C_{s2}$ or the limitation of capacitor values of the first calibration capacitor $C_{s1}$ and the second calibration capacitor $C_{s2}$ when the first calibration capacitor $C_{s1}$ and the second calibration capacitor $C_{s2}$ are programmable capacitor arrays $C_{s3}$) before regulating at least one of the first calibration voltage $V_1$, the second calibration voltage $V_2$, the first calibration capacitor $C_{s1}$ and the second calibration capacitor $C_{s2}$.

When the controller 8 determines that at least one of the first calibration voltage $V_1$, the second calibration voltage $V_2$, the first calibration capacitor $C_{s1}$ and the second calibration capacitor $C_{s2}$ is the extremum, step S42 is performed. In step S42, the controller 8 at least regulates one of the first calibration voltage $V_1$, the second calibration voltage $V_2$, the first calibration capacitor $C_{s1}$ and the second calibration capacitor $C_{s2}$ which do not achieve the extremum to restart calculating the offset value $Q_{offset}$. Specifically, before the controller 8 at least regulates one of the first calibration voltage $V_1$, the second calibration voltage $V_2$, the first calibration capacitor $C_{s1}$ and the second calibration capacitor $C_{s2}$, the controller 8 determines that one of the first calibration voltage $V_1$, the second calibration voltage $V_2$, the first calibration capacitor $C_{s1}$ and the second calibration capacitor $C_{s2}$ is limited to the limitation of apparatus/element and is unable to regulate. Hence, the controller 8 excludes the aforementioned item limited to the limitation of apparatus/element to perform the other items which do not achieve the extremum or are adjustable.

When the controller 8 determines that the first calibration voltage $V_1$, the second calibration voltage $V_2$, the first calibration capacitor $C_{s1}$ and the second calibration capacitor $C_{s2}$ are not the extremum, step S43 is performed. In step S43, the controller 8 may at least regulate one of the first calibration voltage $V_1$, the second calibration voltage $V_2$, the first calibration capacitor $C_{s1}$ and the second calibration capacitor $C_{s2}$ to re-calculate the offset value $Q_{offset}$.

According to the aforementioned description, the present disclosure sets forth a differential capacitor device and a method of calibrating differential capacitor which is able to precisely compensate capacitor errors and decrease noise effectively under the case that manufacturing cost is not obviously increased. The differential capacitor device and the method of calibrating differential capacitor drive make the capacitor sensing component conduct signal compensation and processing by regulating calibration capacitors and voltage calibration signals.

Although embodiments of the present invention are disclosed as the above, it is not meant to limit the scope of the present invention. Any possible modifications and variations based on the embodiments of the present inventions shall fall within the claimed scope of the present invention. The claimed scope of the present invention is defined by the claim as follows.

What is claimed is:

1. A differential capacitor device comprising:
   a differential capacitor sensing component provided with a first differential capacitor and a second differential capacitor, with one terminal of the first differential capacitor coupled to one terminal of the second differential capacitor to form a common point terminal, the other terminal of the first differential capacitor being a first non-common point terminal and the other terminal of the second differential capacitor being a second non-common point terminal;
   a calibration capacitor assembly provided with a first calibration capacitor and a second calibration capacitor, with one terminal of the first calibration capacitor coupled to the first non-common point terminal, one terminal of the second calibration capacitor coupled to the second non-common point terminal, the other terminal of the first calibration capacitor being a first calibration voltage input terminal, the other terminal of the second calibration capacitor being a second calibration voltage input terminal, and the first calibration voltage input terminal and the second calibration voltage input terminal configured to receive a set of calibration voltages; and
   two output terminals respectively coupled to the first non-common point terminal and the second non-common point terminal and configured to output a first signal and a second signal.

2. The differential capacitor device according to claim 1, further comprising a charge voltage converter circuit coupled between the calibration capacitor assembly and the two output terminals and configured to amplify and convert a signal to output.

3. The differential capacitor device according to claim 1, wherein the calibration capacitor assembly is a first calibration capacitor assembly, and the differential capacitor device further comprises a second calibration capacitor assembly coupled between the first calibration capacitor assembly and two output terminals and provided with a third calibration capacitor and a fourth calibration capacitor, with one terminal of the third calibration capacitor coupled to the first non-common point terminal, one terminal of the fourth calibration capacitor coupled to the second non-common point terminal, the other terminal of the third calibration capacitor coupled to a third calibration voltage input terminal, the other terminal of the fourth calibration capacitor coupled to a fourth calibration voltage input terminal, and the third calibration voltage input terminal and the fourth calibration voltage input terminal configured to receive another set of calibration voltages.

4. The differential capacitor device according to claim 1, wherein the calibration capacitor assembly further comprises:
   a first auxiliary capacitor, with one terminal of the first auxiliary capacitor coupled to the first calibration capacitor, and the other terminal of the first auxiliary capacitor coupled to the first calibration voltage input terminal or the first non-common point terminal; and
   a second auxiliary capacitor, with one terminal of the second auxiliary capacitor coupled to the second calibration capacitor, and the other terminal of the second auxiliary capacitor coupled to the second calibration voltage input terminal or the second non-common point terminal.

5. The differential capacitor device according to claim 1, wherein each of the first calibration capacitor and the second calibration capacitor is a programmable capacitor array.

6. The differential capacitor device according to claim 5, wherein the calibration capacitor assembly further comprises:
   a capacitor regulating component coupled to the first calibration capacitor and the second calibration capacitor and configured to regulate capacitance values of the first calibration capacitor and the second calibration capacitor.

7. The differential capacitor device according to claim 1, wherein the set of calibration voltages comprises a first calibration voltage and a second calibration voltage, and the differential capacitor device further comprises a controller coupled to the first calibration voltage input terminal, the second calibration voltage input terminal, the first calibration capacitor and the second calibration capacitor, and configured to generate the first calibration voltage and the second calibration voltage and regulate the first calibration capacitor and the second calibration capacitor.

8. The differential capacitor device according to claim 7, wherein the controller is coupled to the two output terminals and is configured to do a self-calibration by a feedback circuit.

9. A method for calibrating differential capacitor, performed by a controller to operate a differential capacitor device comprising a differential capacitor sensing component, a calibration capacitor assembly and two output terminals, the differential capacitor sensing component provided with a common point terminal, a first non-common point terminal and a second non-common point terminal, the common point terminal configured to receive an input voltage, the first non-common point terminal and the second non-common point terminal configured to output a pair of differential signals, the calibration capacitor assembly provided with a first calibration capacitor and a second calibration capacitor, one terminal of the first calibration capacitor coupled to the first non-common point terminal and the other terminal of the first calibration capacitor configured to receive a first calibration voltage, one terminal of the second calibration capacitor coupled to the second non-common point terminal and the other terminal of the second calibration capacitor configured to receive a second calibration voltage, the calibration capacitor assembly regulates the pair of differential signals to a first signal and a second signal, the two output terminals respectively coupled to the first non-common point terminal and the second non-common point terminal to output a first signal and a second signal, the controller configured to generate the first calibration voltage and the second calibration voltage, and to regulate the first calibration capacitor and the second calibration capacitor, the method of calibrating differential capacitor comprising:
   calculating an offset value between a first output voltage and a second output voltage;
   determining whether the offset value is in a threshold range or not;
   completing calibration when determining the offset value is in the threshold range; and
   at least regulating one of the first calibration voltage, the second calibration voltage, the first calibration capacitor and the second calibration capacitor to re-calculate the offset value when determining the offset value is not in the threshold range.

10. The method for calibrating differential capacitor according to claim 9, wherein the step of at least regulating one of the first calibration voltage, the second calibration voltage, the first calibration capacitor and the second calibration capacitor to re-calculate the offset value comprises:
   determining whether at least one of values of the first calibration voltage, the second calibration voltage, the first calibration capacitor and the second calibration capacitor achieves an extremum of the at least one of first calibration voltage, the second calibration voltage, the first calibration capacitor and the second calibration capacitor or not;
   regulating at least one of the first calibration voltage, the second calibration voltage, the first calibration capacitor and the second calibration capacitor which are not the extremum to restart calculating the offset value when determining at least one of the first calibration voltage, the second calibration voltage, the first calibration capacitor and the second calibration capacitor is the extremum;
   regulating at least one of the first calibration voltage, the second calibration voltage, the first calibration capacitor and the second calibration capacitor which are not the extremum to restart calculating the offset value when determining at least one of the first calibration voltage, the second calibration voltage, the first calibration capacitor and the second calibration capacitor are all not the extremum.

11. The method for calibrating differential capacitor according to claim 10, wherein the controller is coupled to a first calibration voltage input terminal configured to generate a first calibration voltage, a second calibration voltage input terminal configured to generate a second calibration voltage, the first calibration capacitor, the second calibration capacitor, and is selectively coupled to the two output terminals.

* * * * *